US008039311B2

(12) United States Patent
Kuan et al.

(10) Patent No.: US 8,039,311 B2
(45) Date of Patent: Oct. 18, 2011

(54) LEADLESS SEMICONDUCTOR CHIP CARRIER SYSTEM

(75) Inventors: Heap Hoe Kuan, Singapore (SG); Rui Huang, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 344 days.

(21) Appl. No.: 12/205,841

(22) Filed: Sep. 5, 2008

(65) Prior Publication Data

US 2010/0059884 A1    Mar. 11, 2010

(51) Int. Cl.
*H01L 21/00* (2006.01)
(52) U.S. Cl. .............. 438/110; 257/737; 257/E21.499
(58) Field of Classification Search .............. 257/737, 257/738, 778, 779, E21.499; 438/110
See application file for complete search history.

(56) References Cited

U.S. PATENT DOCUMENTS

| 6,072,239 A | 6/2000 | Yoneda et al. |
| 6,372,539 B1 | 4/2002 | Bayan et al. |
| 6,373,140 B1 * | 4/2002 | Onodera et al. ............... 257/780 |
| 6,525,405 B1 | 2/2003 | Chun et al. |
| 6,790,706 B2 | 9/2004 | Jeung et al. |
| 6,841,874 B1 | 1/2005 | Paek et al. |
| 6,987,319 B1 | 1/2006 | Paek et al. |
| 7,002,239 B1 | 2/2006 | Nadarajah et al. |
| 7,056,766 B2 * | 6/2006 | Shiu et al. ..................... 438/106 |
| 2002/0041019 A1 * | 4/2002 | Gang ............................. 257/678 |
| 2009/0174052 A1 * | 7/2009 | Sogawa et al. ................ 257/690 |

* cited by examiner

*Primary Examiner* — Chuong A Luu
*Assistant Examiner* — Nga Doan
(74) *Attorney, Agent, or Firm* — Mikio Ishimaru

(57) ABSTRACT

A semiconductor package system includes: providing a semiconductor die with bonding pad on the semiconductor die; attaching the semiconductor die to an intermediate layer; attaching one end of a bonding wire to the bonding pad; forming a bonding ball at the other end of the bonding wire, the bonding ball being fully or partially embedded in the intermediate layer; encapsulating the semiconductor die, the bonding pad, the bonding wire, and a portion of the bonding ball with a mold compound; removing the intermediate layer, resulting in the bonding ball protruding from the exposed mold compound bottom surface; and conditioning the bonding ball.

20 Claims, 8 Drawing Sheets

LEADLESS SEMICONDUCTOR CHIP CARRIER SYSTEM

TECHNICAL FIELD

The present invention relates generally to semiconductor packages, and more particularly to a leadless semiconductor chip carrier system.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board. Solder joint reliability is an important factor for achieving good quality semiconductor packaging.

Typically, the packages on which these integrated semiconductor chips are mounted include a substrate or other chip-mounting device. One example of such a substrate is a leadframe. Leadframes also typically include at least an area on which an integrated circuit chip is mounted and multiple power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to individual leads of the leadframe.

Leadframes have been used extensively in the integrated circuit packaging industry mainly because of their low manufacturing cost and high reliability. Leadframe packages remain a cost-effective solution for packaging integrated circuits.

Typical leadframe packages include a die attach paddle, or pad, surrounded by a number of leads. The leads are attached to the die pad. An integrated circuit chip is attached to the die pad. After the die is attached to the die pad, a wire-bonding process is used to make electrical interconnections between the integrated circuit and the leads of the leadframe.

One problem that persists with these conventional leadframes is that the leadframe's pre-arranged leads surrounding the die pad occupy a large mounting area which is limiting the output of the number of dies per leadframe after singulation. The modern trend of semiconductor device miniaturization requires that the mounting area of the semiconductor package is minimized. Also, the conventional leadframes have thick package profile which is detrimental to achieving device miniaturization.

Furthermore, separation of the leads from the leadframe so as to electrically insulate each contact from each other is complex and cumbersome.

After wire bonding, the leadframe with the integrated circuit attached is encapsulated using a mold compound. Such enclosures may include encapsulant in a plastic or a multi-part housing made of plastic ceramic, or metal. The enclosure protects the leadframe and the attached chip from physical, electrical, and/or chemical damage. Finally, post mold curing and singulation steps are conducted to complete the packaging process.

Sometimes passive devices are added to the semiconductor package, typically attached between two leads, before the encapsulation. Good flowability of the mold compound under such passive devices is important for ensuring good encapsulation of the semiconductor package. However, the conventional leadframes have poor flowability of the mold compound under such passive devices.

The leadframe and attached chip(s) may be mounted on, for example, a circuit board, or card along with other leadframes or devices. The circuit board or card may then be incorporated into a wide variety of devices such as computers, automobiles, and appliances, among others.

As integrated circuits have become smaller with increased performance capabilities, new leadframes and new processes of wire-bonding, soldering, and mounting for integrated circuits have been adapted to accommodate these integrated circuits.

Leadless leadframe has been proposed to counter some of the problems of the conventional leadframes. However, under the current status of the art, problems still exist concerning the thickness of the package profile, the solder joint reliability, and the mold compound flowability under discrete passive components when such components are added to the package, etc.

Thus, a need still remains for reducing the package thickness, improving the solder joint reliability, and improving the mold compound flowability under discrete passive components. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a semiconductor die with bonding pad on the semiconductor die; attaching the semiconductor die to an intermediate layer; attaching one end of a bonding wire to the bonding pad; forming a bonding ball at the other end of the bonding wire, the bonding ball being fully or partially embedded in the intermediate layer; encapsulating the semiconductor die, the bonding pad, the bonding wire, and a portion of the bonding ball with a mold compound; removing the intermediate layer, resulting in the bonding ball protruding from the exposed mold compound bottom surface; conditioning the bonding ball.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
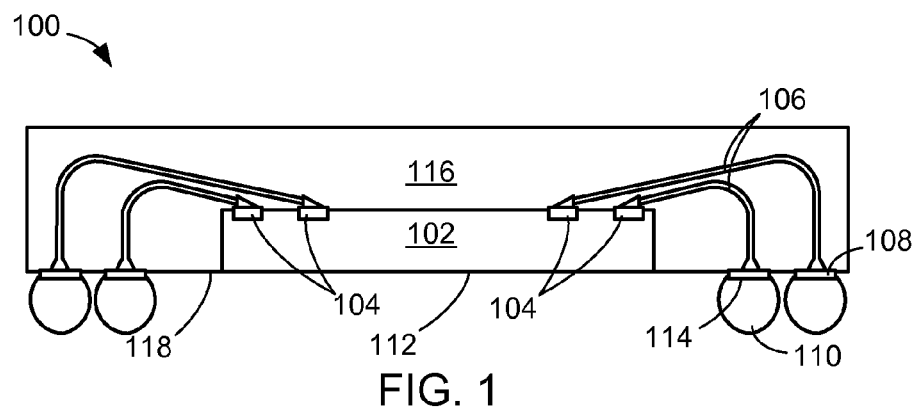
FIG. 1 is a cross-sectional view of an integrated circuit package system along a line 1-1 of FIG. 2 after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

The term "coplanar" is defined as being in the same plane or flat. With regard to an unfinished leadframe the term means that the unfinished leadframe is in one plane and flat as contrasted with having different heights.

Figure 2:
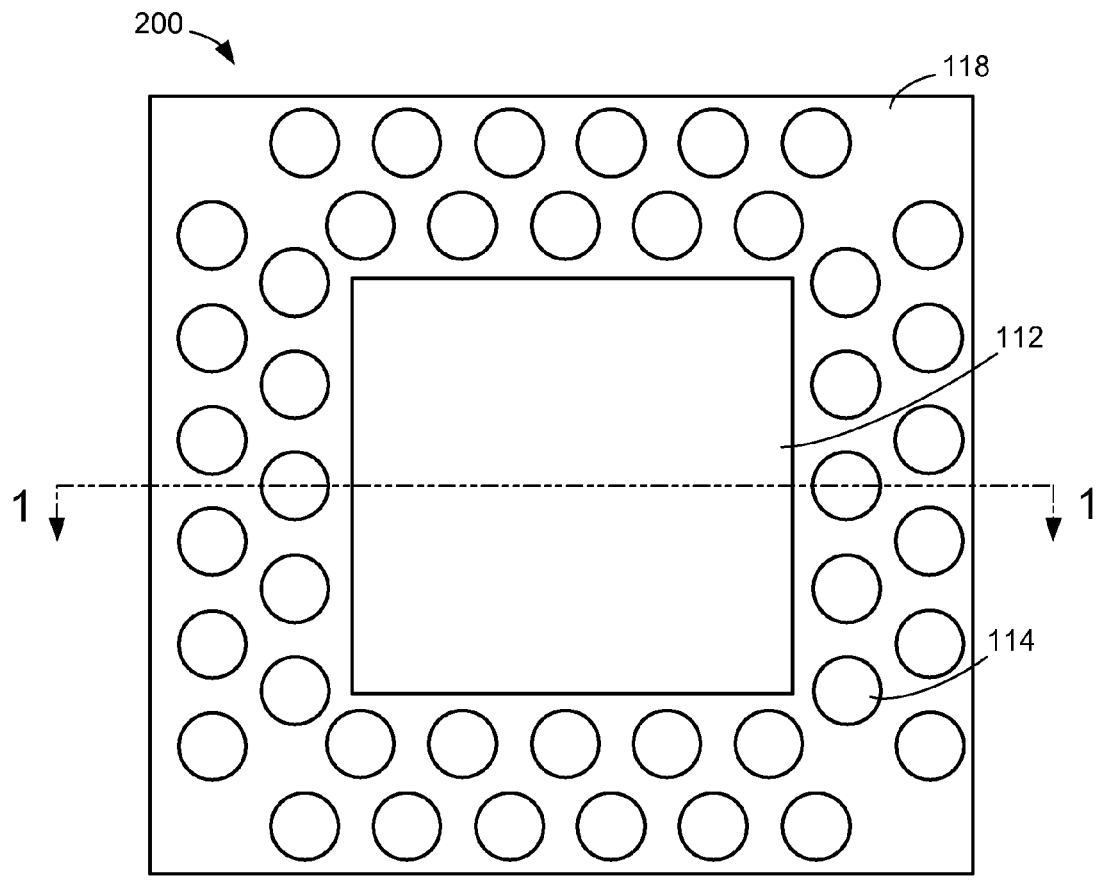
FIG. 2 shows a bottom view of an unfinished semiconductor package of the first embodiment of the present invention after an intermediate stage of the process.

Referring now to FIG. 1, therein is shown a cross-sectional view of an integrated circuit package system along a line 1-1 of FIG. 2 after a stage of singulation. A finished semiconductor package 100 is shown. A semiconductor die 102 is shown. A bonding pad 104 is shown on the semiconductor die 102. The bonding pad 104 is attached to one end of a bonding wire 106. A flattened bonding ball 108 is formed at the other end of the bonding wire 106. The flattened bonding ball 108 functions as a solder pad. A solder ball 110 is attached to the flattened bonding ball 108.

The semiconductor die 102 has an exposed die bottom surface 112. The flattened bonding ball 108 has a bonding ball flattened surface 114. The semiconductor die 102, the bonding pad 104, the bonding wire 106, and a portion of the flattened bonding ball 108 are encapsulated by a mold compound 116. The mold compound 116 has an exposed mold compound bottom surface 118. The flattened bonding ball 108 protrudes from the exposed mold compound bottom surface 118. The bonding ball flattened surface 114 and the exposed mold compound bottom surface 118 are not coplanar.

The flattened bonding ball 108 leads to reduced thickness of the finished semiconductor package 100 compared to previous packages. The existence of the bonding ball flattened surface 114 increases the wetting contact area with the solder ball 110 and thus provides a better adhesion of the solder ball 110 to the flattened bonding ball 108. This better adhesion also improves the solder joint reliability compared to previous packages. The solder joint reliability is also improved due to mechanical locking effect provided by the protruding nature of the flattened bonding ball 108.

Referring now to FIG. 2, therein is shown a bottom view of an unfinished semiconductor package 200 of the first embodiment of the present invention after an intermediate stage of the process. The exposed die bottom surface 112, the bonding ball flattened surface 114, and the exposed mold compound bottom surface 118 are shown. The bonding ball flattened surface 114 and the exposed mold compound bottom surface 118 are not coplanar. In FIG. 2, the solder ball 110 shown in FIG. 1 is not yet attached to the unfinished semiconductor package 200.

Figure 3:
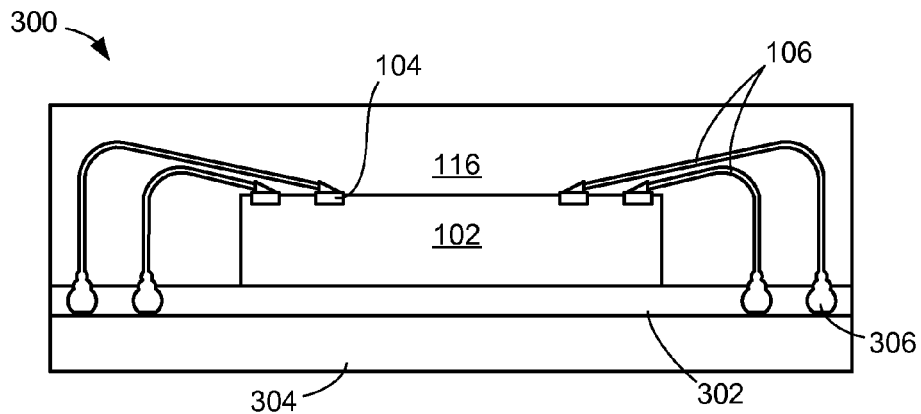
FIG. 3 shows a cross-sectional view of an unfinished semiconductor package of the first embodiment of the present invention after a first intermediate stage of the process.

Referring now to FIG. 3, therein is shown a cross-sectional view of an unfinished semiconductor package 300 of the first embodiment of the present invention after a first intermediate stage of the process. The semiconductor die 102 is attached to a penetrable layer 302. The penetrable layer 302 is further attached to a support layer 304. The combination of the penetrable layer 302 and the support layer 304 constitute an intermediate layer. The bonding pad 104 is attached to one end of the bonding wire 106. A bonding ball 306 is formed at the other end of the bonding wire 106.

In a typical bonding process, the bonding wire 106 is made of gold, aluminum, or copper and the bonding ball 306 is formed out of the bonding wire 106 by bonding tools so that the bonding wire 106 and the bonding ball 306 belong to one integral piece.

The penetrable layer 302 allows the bonding tools to cause the bonding wire 106 to penetrate into the penetrable layer 302 and form the bonding ball 306 inside the penetrable layer 302. The wire bonding process is done in a way that the bonding ball 306 is fully or partially embedded in the penetrable layer 302. The support layer 304 allows the bonding ball 306 to rest on the support layer 304.

The semiconductor die 102, the bonding pad 104, the bonding wire 106, and a portion of the bonding ball 306 are then encapsulated by the mold compound 116.

Figure 4:
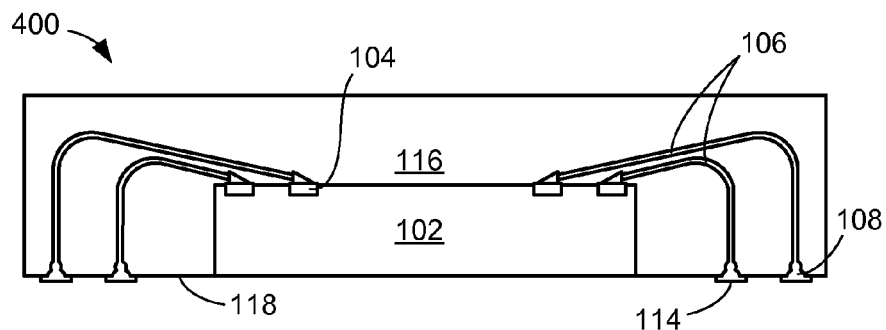
FIG. 4 shows a cross-sectional view of an unfinished semiconductor package of the first embodiment of the present invention after a second intermediate stage of the process.

Referring now to FIG. 4, therein is shown a cross-sectional view of an unfinished semiconductor package 400 of the first embodiment of the present invention after a second intermediate stage of the process. The penetrable layer 302 and the support layer 304 shown in FIG. 3 are now removed. The bonding ball 306 now protrudes from the exposed mold compound bottom surface 118. The bonding ball 306 shown in FIG. 3 is then conditioned. The conditioning in this embodiment is a process of pressing the bond ball 306 by impact or by coining. Conditioning forms the bond ball 306 into the flattened bonding ball 108. The flattened bonding ball 108 has the bonding ball flattened surface 114. The flattened bonding ball 108 resulting from such conditioning could also be called a conditioned bonding ball.

There are other ways of conditioning the bonding ball 306 after the bonding ball 306 protrudes from the exposed mold compound bottom surface 118. Depositing certain materials on the surface of the bonding ball 306 resulting in the bonding ball 306 covered by such materials is another type of conditioning the bonding ball 306. Such type of conditioning will be encountered in other embodiments of the present invention described below.

The semiconductor die 102, the bonding pad 104, the bonding wire 106, and a portion of the flattened bonding ball 108 are still encapsulated by the mold compound 116. Afterwards the solder ball 110 shown in FIG. 1 will be attached to the flattened bonding ball 108.

Figure 5A:
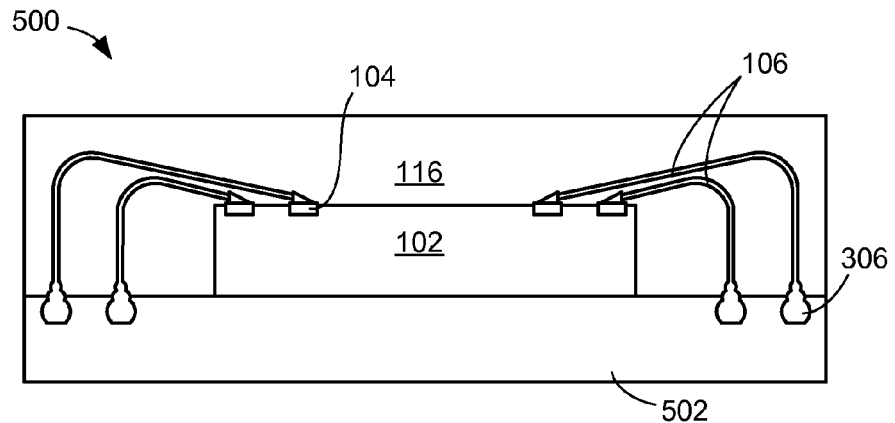
FIG. 5A shows a cross-sectional view of an unfinished semiconductor package of the first embodiment of the present invention after a first alternative intermediate stage of the process.
Figure 5B:
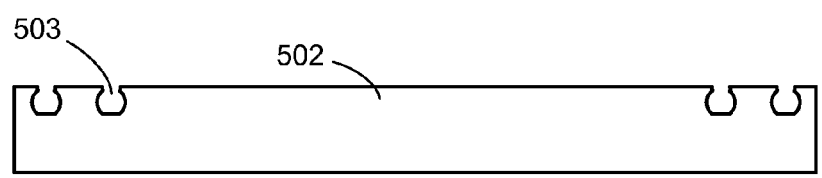
FIG. 5B shows an etchable metal layer with surface dimples.

Referring now to FIG. 5A, therein is shown a cross-sectional view of an unfinished semiconductor package 500 of the first embodiment of the present invention after an alternative first intermediate stage of the process. The semiconductor die 102 is attached to an etchable metal layer 502. The etchable metal layer 502 may be made from Cu or Cu alloys or other materials. FIG. 5B shows the etchable metal layer 502 before it is attached to the semiconductor die 102. The etchable metal layer 502 has a surface dimple 503 on it. The etchable metal layer 502 may be fully or selectively plated for wire bonding purposes. The surface dimple 503 on the etchable metal layer 502 will become the receptacle for the bonding ball 306.

The advantage of using the etchable metal layer 502 is that only a single layer would be required for achieving the wire bonding, compared to the two-layer combination of the penetrable layer 302 and the support layer 304, thus making the manufacturing process simpler and more efficient.

The bonding pad 104 is attached to one end of the bonding wire 106. The bonding ball 306 is formed at the other end of the bonding wire 106. The wire bonding process is done in a way that the bonding ball 306 is formed in the surface dimple 503 on the etchable metal layer 502 and is fully or partially embedded in the etchable metal layer 502.

The semiconductor die 102, the bonding pad 104, the bonding wire 106, and a portion of the bonding ball 306 are then encapsulated by the mold compound 116.

Figure 6:
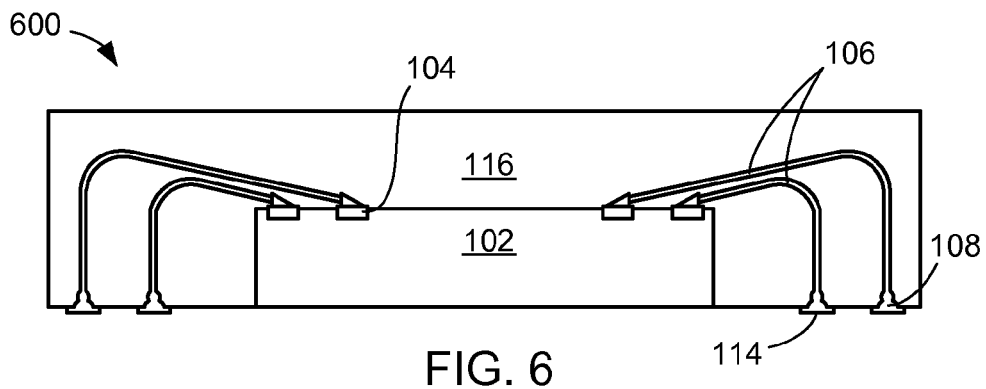
FIG. 6 shows a cross-sectional view of an unfinished semiconductor package of the first embodiment of the present invention after a second alternative intermediate stage of the process.

Referring now to FIG. 6, therein is shown a cross-sectional view of an unfinished semiconductor package 600 of the first embodiment of the present invention after an alternative second intermediate stage of the process. The etchable metal layer 502 shown in FIG. 5 is now removed. The bonding ball 306 shown in FIG. 5 is pressed and the flattened bonding ball 108 is formed. The flattened bonding ball 108 has the bonding ball flattened surface 114.

The semiconductor die 102, the bonding pad 104, the bonding wire 106, and a portion of the flattened bonding ball 108 are still encapsulated by the mold compound 116. Afterwards the solder ball 110 shown in FIG. 1 will be attached to the flattened bonding ball 108.

Figure 7A:
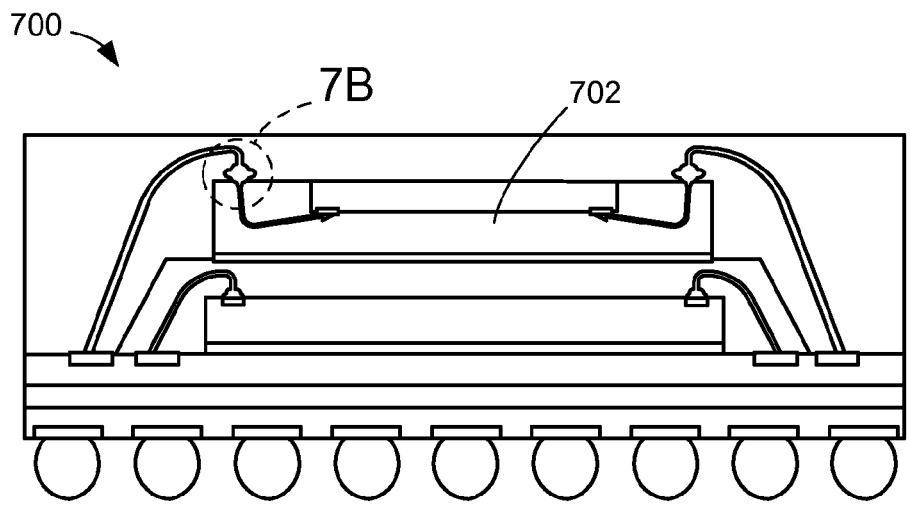
FIG. 7A shows a cross-sectional view of a second embodiment of the present invention exemplified in a first-type package-in-package semiconductor package.
Figure 7B:
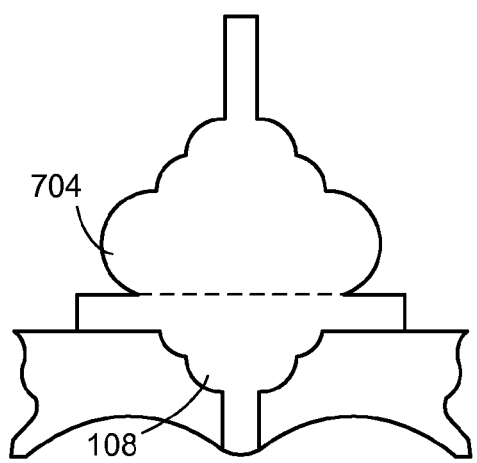
FIG. 7B shows an enlarged view of the portion of FIG. 7A circled by dashed lines.

Referring now to FIG. 7A, therein is shown a cross-sectional view of a second embodiment of the present invention exemplified in a first-type package-in-package semiconductor package 700. FIG. 7B shows an enlarged view of the portion of FIG. 7A circled by the dashed lines.

A package-in-package semiconductor package is a three dimensional package technology in which separately assembled and tested packages and bare chips are stacked together in a single chip scale package. The purpose of such a package is to achieve exceptional integration flexibility and functional density in smaller space.

A component of the first-type package-in-package semiconductor package 700 is an internal stacking module 702. The unfinished semiconductor package 400 in FIG. 4 or the unfinished semiconductor package 600 in FIG. 6 may constitute the internal stacking module 702. The flattened bonding ball 108 of the internal stacking module 702 is in contact with a package-in-package bonding ball 704. The package-in-package bonding ball 704 may be made out of gold, aluminum, copper or other materials. The existence of the flattened bonding ball 108 helps reducing the thickness of the first-type package-in-package semiconductor package 700.

Figure 8A:
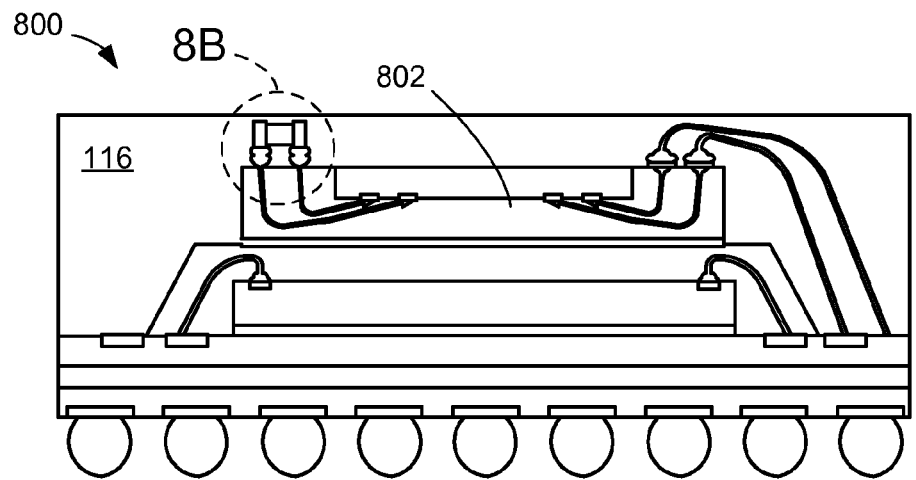
FIG. 8A shows a cross-sectional view of a third embodiment of the present invention exemplified in a second-type package-in-package semiconductor package.
Figure 8B:
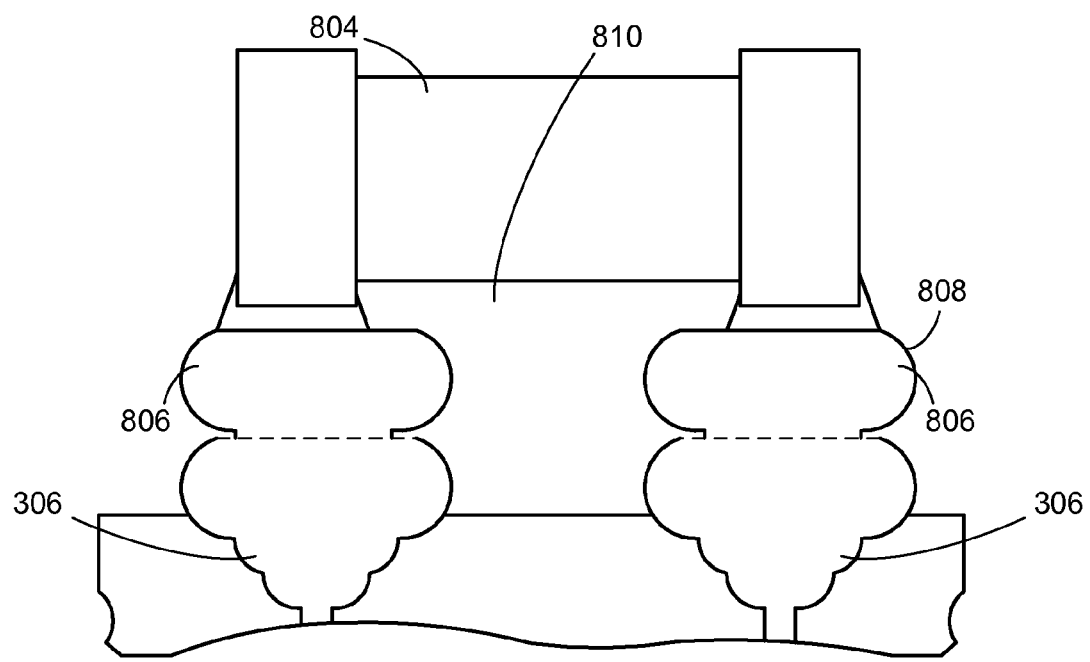
FIG. 8B shows an enlarged view of the portion of FIG. 8A circled by dashed lines.

Referring now to FIG. 8A, therein is shown a cross-sectional view of a third embodiment of the present invention exemplified in a second-type package-in-package semiconductor package 800. FIG. 8B shows an enlarged view of the portion of FIG. 8A circled by the dashed lines. A component of the second-type package-in-package semiconductor package 800 is an internal stacking module 802. The unfinished semiconductor package 400 in FIG. 4 or the unfinished semiconductor package 600 in FIG. 6, prior to the bonding ball 306 is pressed to form the flattened bonding ball 108, may constitute the internal stacking module 802. Another component of the second-type package-in-package semiconductor package 800 is a discrete passive component 804. The discrete passive component 804 has a contact bonding ball 806. The contact bonding ball 806 may be made out of gold, aluminum, copper or other materials. The bonding ball 306 of the internal stacking module 802 and the contact bonding ball 806 are in contact with each other to form a contact stack 808. Between two contact stacks 808 there exists a contact spacing 810. The existence of the contact spacing 810 helps improving the flowability of the mold compound 116 under the discrete passive component 804 compared to previous packages.

Figure 9A:
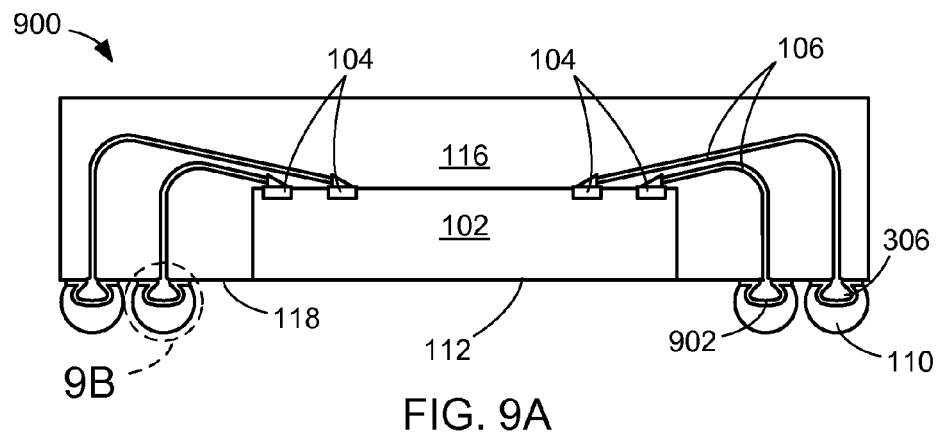
FIG. 9A shows a cross-sectional view of a fourth embodiment of the present invention after a stage of singulation.

Referring now to FIG. 9A, therein is shown a cross-sectional view of a fourth embodiment of the present invention after a stage of singulation. A finished semiconductor package 900 is shown. The semiconductor die 102 is shown. The bonding pad 104 is shown on the semiconductor die 102. The bonding pad 104 is attached to one end of the bonding wire 106. The bonding ball 306 is formed at the other end of the bonding wire 106.

The semiconductor die 102, the bonding pad 104, the bonding wire 106, and a portion of the bonding ball 306 are encapsulated by the mold compound 116.

A solder wettable layer 902 is attached to the surface of the bonding ball 306. The solder ball 110 is attached to the solder wettable layer 902 and surrounds the bonding ball 306.

The semiconductor die 102 has the exposed die bottom surface 112. The mold compound 116 has the exposed mold compound bottom surface 118. The bonding ball 306 protrudes from the exposed mold compound bottom surface 118.

The existence of the protrusion of the bonding ball 306 and the solder wettable layer 902 helps achieving better solder joint reliability. The solder wettable layer 902 can consist of a single or multiple layers of metal or metal alloy like Au, Ni, Pd, Ag, Ti, and etc.

Figure 9B:
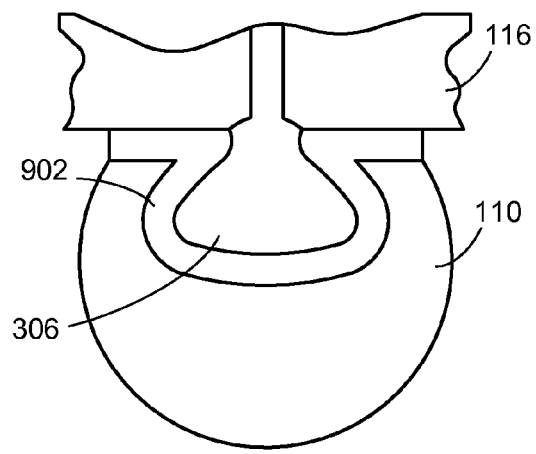
FIG. 9B shows an enlarged view of the portion of FIG. 9A circled by dashed lines.

Referring now to FIG. 9B, therein is shown an enlarged view of the portion of FIG. 9A circled by dashed lines.

Figure 10:
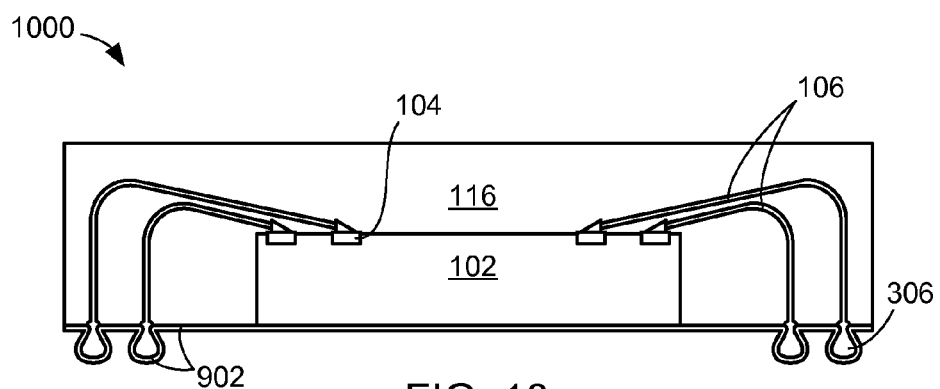
FIG. 10 shows a cross-sectional view of an unfinished semiconductor package of the fourth embodiment of the present invention after a first intermediate stage of the process.

Referring now to FIG. 10, therein is shown a cross-sectional view of an unfinished semiconductor package 1000 of the fourth embodiment of the present invention after a first intermediate stage of the process. The bonding ball 306 has already been formed by the bonding process. The bonding pad 104 is attached to one end of the bonding wire 106. The bonding ball 306 is formed at the other end of the bonding wire 106.

The semiconductor die 102, the bonding pad 104, the bonding wire 106, and a portion of the bonding ball 306 are already encapsulated by the mold compound 116. Then, the solder wettable layer 902 is deposited on the bottom surface. The method of such deposition could be a Physical Vapor Deposition process.

Figure 11:
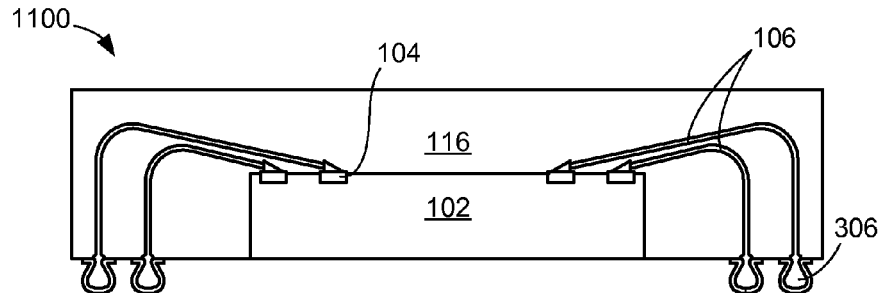
FIG. 11 shows a cross-sectional view of an unfinished semiconductor package of the fourth embodiment of the present invention after a second intermediate stage of the process.

Referring now to FIG. 11, therein is shown a cross-sectional view of an unfinished semiconductor package 1100 of the fourth embodiment of the present invention after a second intermediate stage of the process. The solder wettable layer 902 is patterned and portions of the solder wettable layer 902 are removed. The portion of the solder wettable layer 902 covering the bonding ball 306 remains. Afterwards the solder ball 110 shown in FIG. 1 will be attached to the solder wettable layer 902 and surrounds the bonding ball 306.

The method of such patterning could be photolithography or other types of lithography. The removal method could be an etching process.

Figure 12A:
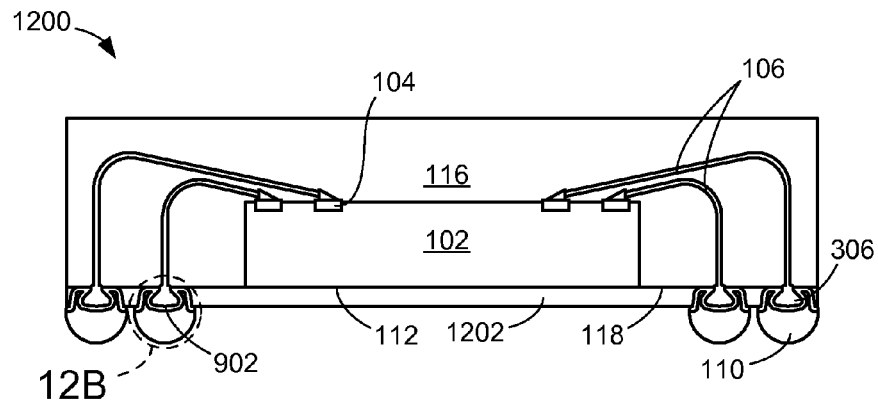
FIG. 12A shows a cross-sectional view of a fifth embodiment of the present invention after a stage of singulation.

Referring now to FIG. 12A, therein is shown a cross-sectional view of a fifth embodiment of the present invention after a stage of singulation. A finished semiconductor package 1200 is shown. The semiconductor die 102 is shown. The bonding pad 104 is shown on the semiconductor die 102. The bonding pad 104 is attached to one end of the bonding wire 106. The bonding ball 306 is formed at the other end of the bonding wire 106.

The solder wettable layer 902 is attached to the surface of the bonding ball 306. An insulating layer 1202 is attached to the exposed die bottom surface 112 and the exposed mold compound bottom surface 118. The insulating layer 1202 is also in touch with the solder wettable layer 902 in the vicinity of the bonding ball 306. The bonding ball 306 protrudes from the exposed mold compound bottom surface 118. The solder ball 110 is attached to the solder wettable layer 902 and surrounds the bonding ball 306.

The semiconductor die 102, the bonding pad 104, the bonding wire 106, and a portion of the bonding ball 306 are encapsulated by the mold compound 116.

The existence of the protrusion of the bonding ball 306 and the solder wettable layer 902 helps achieving better solder joint reliability and better adhesion. The solder wettable layer 902 can consist of a single or multiple layers of metal or metal alloy like Au, Ni, Pd, Ag, Ti, and etc.

Figure 12B:
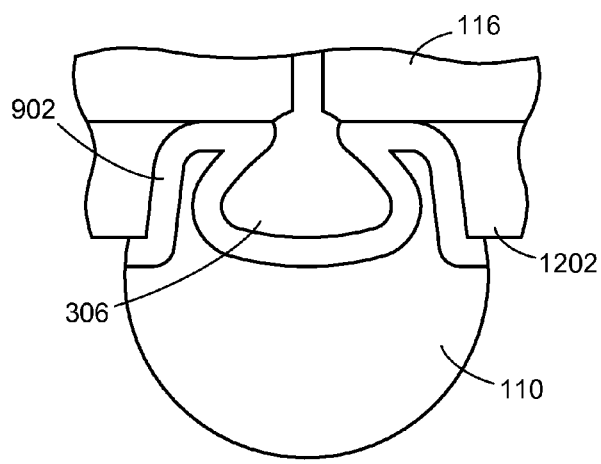
FIG. 12B shows an enlarged view of the portion of FIG. 12A circled by dashed lines.

Referring now to FIG. 12B, therein is shown an enlarged view of the portion of FIG. 12A circled by dashed lines.

Figure 13:
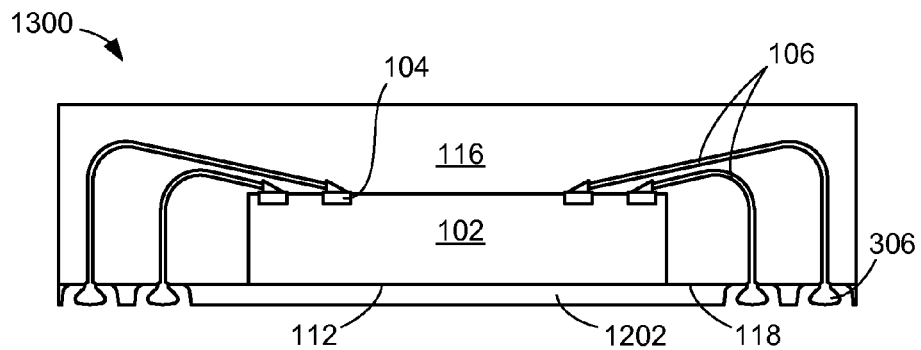
FIG. 13 shows a cross-sectional view of an unfinished semiconductor package of the fifth embodiment of the present invention after a first intermediate stage of the process.

Referring now to FIG. 13, therein is shown a cross-sectional view of an unfinished semiconductor package 1300 of the fifth embodiment of the present invention after a first intermediate stage of the process. The semiconductor die 102, the bonding pad 104, the bonding wire 106, and a portion of the bonding ball 306 are already encapsulated by the mold compound 116.

Then the insulating layer 1202 is deposited on the bottom surface. The insulating layer 1202 could be a solder non-wettable material such as solder mask or a passivation material such as $Si_3N_4$, $SiO_2$, etc. The insulating layer 1202 is subsequently patterned and a portion of the insulating layer 1202 is removed to expose the bonding ball 306. The method of such deposition could be a spin coating or stencil printing process. The method of such patterning could be photolithography or other types of lithography. The removal method could be an etching process.

Figure 14:
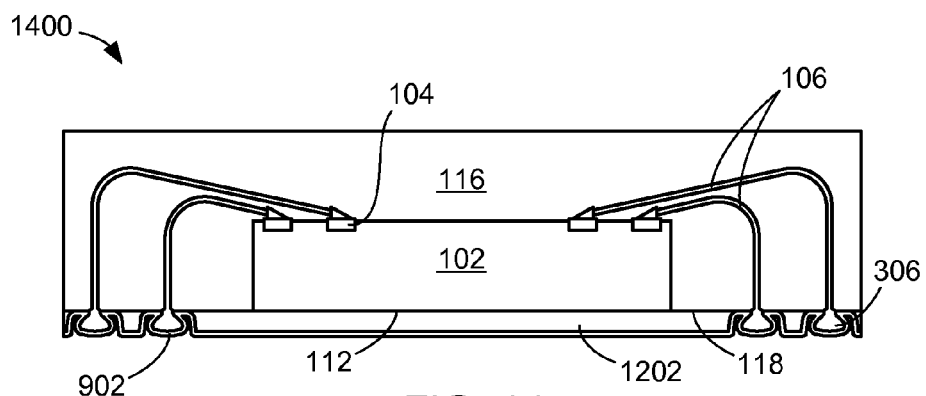
FIG. 14 shows a cross-sectional view of an unfinished semiconductor package of the fifth embodiment of the present invention after a second intermediate stage of the process.

Referring now to FIG. 14, therein is shown a cross-sectional view of an unfinished semiconductor package 1400 of the fifth embodiment of the present invention after a second intermediate stage of the process. The solder wettable layer 902 is deposited on the bottom surface. The method of such deposition could be a Physical Vapor Deposition process.

Figure 15:
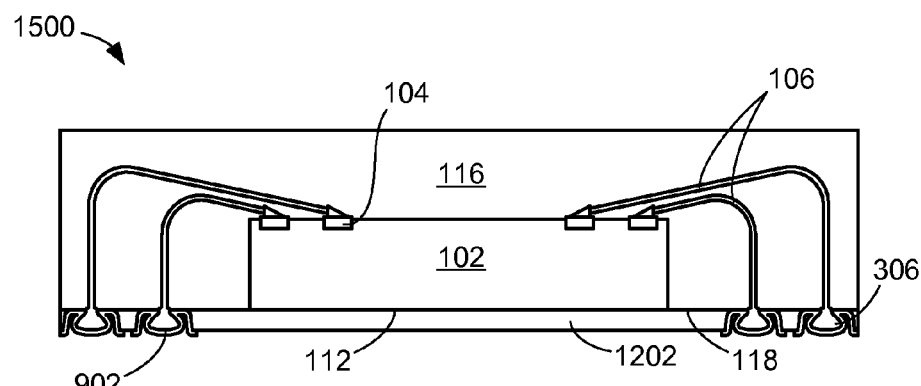
FIG. 15 shows a cross-sectional view of an unfinished semiconductor package of the fifth embodiment of the present invention after a third intermediate stage of the process.

Referring now to FIG. 15, therein is shown a cross-sectional view of an unfinished semiconductor package 1500 of the fifth embodiment of the present invention after a third intermediate stage of the process. The solder wettable layer 902 is patterned and a portion of the solder wettable layer 902 is removed. The portion of the solder wettable layer 902 covering the bonding ball 306 remains.

The method of such patterning could be photolithography or other types of lithography. The removal method could be an etching process.

The semiconductor die 102, the bonding pad 104, the bonding wire 106, and a portion of the bonding ball 306 are still encapsulated by the mold compound 116. Afterwards the solder ball 110 show in FIG. 1 will be attached to the solder wettable layer 902 and surrounds the bonding ball 306.

Figure 16:
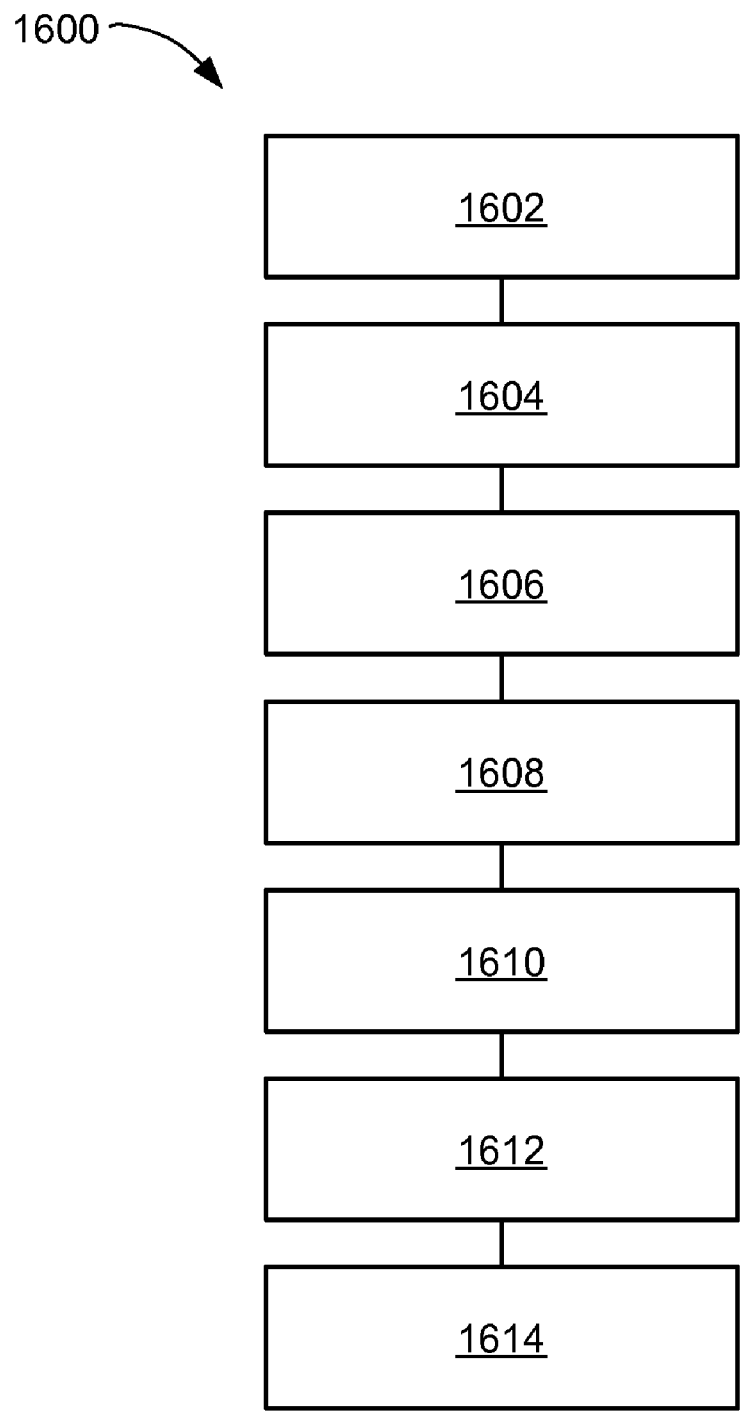
FIG. 16 is a flow chart of a semiconductor package system for manufacturing the finished semiconductor package system in an embodiment of the present invention.

Referring now to FIG. 16, therein is shown a flow chart of a semiconductor package system 1600 for manufacturing the finished semiconductor package 100 in an embodiment of the present invention. The semiconductor package system 1600 includes providing a semiconductor die with bonding pad on the semiconductor die in a block 1602; attaching the semiconductor die to an intermediate layer in a block 1604; attaching one end of a bonding wire to the bonding pad in a block 1606; forming a bonding ball at the other end of the bonding wire, the bonding ball being fully or partially embedded in the intermediate layer in a block 1608; encapsulating the semiconductor die, the bonding pad, the bonding wire, and a portion of the bonding ball with a mold compound in a block 1610; removing the intermediate layer, resulting in the bonding ball protruding from the exposed mold compound bottom surface in a block 1612; conditioning the bonding ball in a block 1614.

Yet another important aspect of the present invention is that it valuably supports and services the historical trend of reducing manufacturing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a semiconductor package system comprising:
   providing a semiconductor die with bonding pad on the semiconductor die;
   attaching the semiconductor die to an intermediate layer;
   attaching one end of a bonding wire to the bonding pad;
   forming a bonding ball at the other end of the bonding wire, the bonding ball being fully or partially embedded in the intermediate layer;
   encapsulating the semiconductor die, the bonding pad, the bonding wire, and a portion of the bonding ball with a mold compound;
   removing the intermediate layer, resulting in the bonding ball protruding from the exposed mold compound bottom surface; and
   conditioning the bonding ball.

2. The method as claimed in claim 1 wherein attaching the semiconductor die to an intermediate layer includes attaching the semiconductor die to an etchable metal layer.

3. The method as claimed in claim 1 further comprising:
   attaching solder ball to the bonding ball.

4. The method as claimed in claim 1 further comprising:
   attaching the conditioned bonding ball to a package-in-package bonding ball of a first-type package-in-package semiconductor package.

5. The method as claimed in claim 1 further comprising:
   attaching the bonding ball to a contact bonding ball of a discrete passive component of a second-type package-in-package semiconductor package, the bonding ball and the contact bonding ball together forming a contact stack; and
   forming a contact spacing between two contact stacks.

6. A method for manufacturing a semiconductor package system comprising:
   providing a semiconductor die with bonding pad on the semiconductor die;
   attaching the semiconductor die to a penetrable layer and further attaching the penetrable layer to a support layer;
   attaching one end of a bonding wire to the bonding pad;
   forming a bonding ball at the other end of the bonding wire, the bonding ball being fully or partially embedded in the penetrable layer;
   encapsulating the semiconductor die, the bonding pad, the bonding wire, and a portion of the bonding ball with a mold compound;
   removing the penetrable layer and the support layer, resulting in the bonding ball protruding from the exposed mold compound bottom surface;
   conditioning the bonding ball; and
   attaching solder ball.

7. The method as claimed in claim 6 wherein conditioning the bonding ball includes pressing the bonding ball to form a flattened bonding ball.

8. The method as claimed in claim 6 wherein forming the bonding ball at the other end of the bonding wire includes forming the bonding ball at the other end of the bonding wire made out of aluminum.

9. The method as claimed in claim 6 wherein conditioning the bonding ball includes:
   attaching a solder wettable layer to the bonding ball;
   patterning the solder wettable layer; and
   removing a portion of the solder wettable layer.

10. The method as claimed in claim 6 wherein conditioning the bonding ball includes:
    depositing an insulating layer to the bottom surface;
    patterning the insulating layer;
    removing a portion of the insulating layer to expose the bonding ball;
    depositing a solder wettable layer to the bottom surface;
    patterning the solder wettable layer; and
    removing a portion of the solder wettable layer.

11. A semiconductor package system comprising:
    a die;
    a bonding pad on the die;
    a bonding wire with one end attached to the bonding pad;
    a conditioned bonding ball formed at the other end of the bonding wire; and
    a mold compound encapsulating the die, the bonding pad, the bonding wire, and a portion of the bonding ball, the bonding ball protruding from the exposed mold compound bottom surface.

12. The system as claimed in claim 11 wherein the bonding wire and the bonding ball are made out of copper.

13. The system as claimed in claim 11 further comprising a solder ball attached to the bonding ball.

14. The system as claimed in claim 11 further comprising:
    a first-type package-in-package semiconductor package with the conditioned bonding ball, including the flattened bonding ball, attached to a package-in-package bonding ball of the first-type package-in-package semiconductor package.

15. The system as claimed in claim 11 further comprising:
    a second-type package-in-package semiconductor package with the bonding ball attached to a contact bonding ball of a discrete passive component of the second-type package-in-package semiconductor package; and a contact spacing formed between two contact stacks.

16. The system as claimed in claim 11 wherein:

the die is a semiconductor die; and the bonding pad is on a semiconductor die; and further comprising:

a solder ball attached to the conditioned bonding ball.

17. The system as claimed in claim 16 wherein the conditioned bonding ball is a flattened bonding ball.

18. The system as claimed in claim 16 wherein the conditioned bonding ball is made out of aluminum.

19. The system as claimed in claim 16 wherein the conditioned bonding ball is covered with a solder wettable layer.

20. The system as claimed in claim 16 wherein:

the conditioned bonding ball is covered with a solder wettable layer; and the exposed mold compound bottom surface, the exposed die bottom surface, and one side of the solder wettable layer are covered by an insulating layer.

* * * * *